(12) United States Patent
Gallup et al.

(10) Patent No.: US 7,413,917 B2
(45) Date of Patent: Aug. 19, 2008

(54) INTEGRATED OPTICS AND ELECTRONICS

(75) Inventors: Kendra J. Gallup, Marina del Ray, CA (US); James Albert Matthews, Milpitas, CA (US)

(73) Assignee: Avago Technologies Fiber IP Pte Ltd, Singapore (SG)

( * ) Notice: Subject to any disclaimer, the term of this patent is extended or adjusted under 35 U.S.C. 154(b) by 0 days.

(21) Appl. No.: 11/172,680

(22) Filed: Jul. 1, 2005

(65) Prior Publication Data

US 2005/0265722 A1    Dec. 1, 2005

(51) Int. Cl.
*H01L 33/00* (2006.01)
*G02B 6/42* (2006.01)

(52) U.S. Cl. .............. 438/27; 257/98; 257/82; 257/E33.073; 372/50.1; 372/50.23; 385/49; 385/90

(58) Field of Classification Search ............. 372/50.23; 438/27
See application file for complete search history.

(56) References Cited

U.S. PATENT DOCUMENTS

| | | | |
|---|---|---|---|
| 3,816,847 A | 6/1974 | Nagao | |
| 4,307,934 A | 12/1981 | Palmer | |
| 4,680,733 A | 7/1987 | Duforestel et al. | |
| 4,847,848 A | 7/1989 | Inoue et al. | |
| 4,966,430 A * | 10/1990 | Weidel ................... 385/14 | |
| 4,993,799 A | 2/1991 | Stein | |
| 5,104,242 A | 4/1992 | Ishikawa | |
| 5,195,156 A | 3/1993 | Freeman et al. | |
| 5,390,271 A | 2/1995 | Priest | |
| 5,394,490 A | 2/1995 | Kato et al. | |
| 5,485,021 A | 1/1996 | Abe | |
| 5,512,860 A | 4/1996 | Huscroft et al. | |
| 5,513,289 A | 4/1996 | Hosokawa et al. | |
| 5,532,524 A | 7/1996 | Townsley et al. | |
| 5,552,918 A | 9/1996 | Krug et al. | |
| 5,565,672 A | 10/1996 | Siegel et al. | |
| 5,566,265 A * | 10/1996 | Spaeth et al. .............. 385/93 |
| 5,577,142 A * | 11/1996 | Mueller-Fiedler et al. ..... 385/47 |
| 5,578,863 A | 11/1996 | De Poorter | |
| 5,602,855 A | 2/1997 | Whetsel, Jr. | |
| 5,665,982 A | 9/1997 | Torikai | |
| 5,742,833 A | 4/1998 | Dea et al. | |
| 5,781,422 A | 7/1998 | Lavin et al. | |
| 5,801,402 A | 9/1998 | Shin | |
| 5,822,352 A | 10/1998 | Mizutani et al. | |

(Continued)

FOREIGN PATENT DOCUMENTS

DE    3834335    4/1990

(Continued)

OTHER PUBLICATIONS

"German Office Action involving counterpart German Patent Application", No. 102004025775, (Feb. 16, 2007),2-54.
"English Translation of German Office Action involving counterpart German Patent Application", No. 102004025775, (Feb. 16, 2007),2-54.
"German Office Action; involving counterpart German Patent Application No.", 102004026990, (Feb. 21, 2007),4-54.
"English translation of German Office Action involving counterpart German Paten Applicationm No.", 102004026990, (Feb. 21, 2007),4-54.

(Continued)

*Primary Examiner*—Jerome Jackson, Jr.

(57) ABSTRACT

An optoelectronic device includes a submount and a lid. The submount includes a substrate and a lens and a laser above the substrate. The lid defines a cavity having a surface coated with a reflective material to form a 45 degree mirror. The mirror reflects a light from the laser to the lens and the light exits the optoelectronic device through the submount.

6 Claims, 13 Drawing Sheets

U.S. PATENT DOCUMENTS

| | | | |
|---|---|---|---|
| 5,835,514 | A | 11/1998 | Yuen et al. |
| 5,867,620 | A | 2/1999 | Bunin et al. |
| 5,875,205 | A | 2/1999 | Spaeth et al. |
| 5,883,988 | A | 3/1999 | Yamamoto et al. |
| 5,912,872 | A | 6/1999 | Feldman |
| 5,940,564 | A | 8/1999 | Jewell |
| 5,956,370 | A | 9/1999 | Ducaroir et al. |
| 5,981,945 | A | 11/1999 | Spaeth et al. |
| 5,998,982 | A | 12/1999 | Groeneveld et al. |
| 6,016,548 | A | 1/2000 | Nakamura et al. |
| 6,036,872 | A | 3/2000 | Wood et al. |
| 6,037,641 | A | 3/2000 | Goel |
| 6,047,380 | A | 4/2000 | Nolan et al. |
| 6,079,025 | A | 6/2000 | Fung |
| 6,085,048 | A | 7/2000 | Mikoshiba et al. |
| 6,085,328 | A | 7/2000 | Klein et al. |
| 6,089,456 | A | 7/2000 | Walsh et al. |
| 6,115,763 | A | 9/2000 | Douskey et al. |
| 6,126,325 | A | 10/2000 | Yamane et al. |
| 6,144,787 | A | 11/2000 | Johnston et al. |
| 6,187,211 | B1 | 2/2001 | Smith et al. |
| 6,201,829 | B1 | 3/2001 | Schneider |
| 6,228,675 | B1 | 5/2001 | Ruby et al. |
| 6,230,277 | B1 | 5/2001 | Nakaoka et al. |
| 6,234,687 | B1 | 5/2001 | Hall et al. |
| 6,243,508 | B1 | 6/2001 | Jewell et al. |
| 6,265,246 | B1 | 7/2001 | Ruby et al. |
| 6,274,890 | B1 | 8/2001 | Oshio et al. |
| 6,275,513 | B1 | 8/2001 | Chang-Hasnain et al. |
| 6,303,922 | B1 | 10/2001 | Kasper |
| 6,354,747 | B1 | 3/2002 | Irie et al. |
| 6,372,680 | B1 | 4/2002 | Ruby et al. |
| 6,416,238 | B1 | 7/2002 | Gilliland et al. |
| 6,422,766 | B1 | 7/2002 | Althaus et al. |
| 6,429,511 | B2 | 8/2002 | Ruby et al. |
| 6,445,514 | B1 | 9/2002 | Ohnstein et al. |
| 6,460,143 | B1 | 10/2002 | Howard et al. |
| 6,540,412 | B2 | 4/2003 | Yonemura et al. |
| 6,556,608 | B1 | 4/2003 | Gilliland et al. |
| 6,567,439 | B1 | 5/2003 | Auracher et al. |
| 6,567,590 | B1 | 5/2003 | Okada et al. |
| 6,599,666 | B2 | 7/2003 | Rolfson |
| 6,608,476 | B1 | 8/2003 | Mirov et al. |
| 6,652,158 | B2 | 11/2003 | Bartur et al. |
| 6,684,033 | B1 | 1/2004 | Doh et al. |
| 6,686,580 | B1 | 2/2004 | Glenn et al. |
| 6,731,882 | B1 * | 5/2004 | Althaus et al. ............... 398/139 |
| 6,757,308 | B1 | 6/2004 | Eldring et al. |
| 6,759,723 | B2 | 7/2004 | Silverbrook |
| 6,774,404 | B2 | 8/2004 | Imai |
| 6,777,263 | B1 | 8/2004 | Gan et al. |
| 6,787,897 | B2 | 9/2004 | Geefay et al. |
| 6,801,196 | B1 | 10/2004 | Bodley et al. |
| 6,874,107 | B2 | 3/2005 | Lesea |
| 6,905,618 | B2 | 6/2005 | Matthews et al. |
| 6,919,222 | B2 | 7/2005 | Geefay |
| 6,947,224 | B2 | 9/2005 | Wang et al. |
| 6,956,992 | B2 | 10/2005 | Coleman |
| 6,977,960 | B2 | 12/2005 | Takinosawa |
| 6,979,810 | B2 | 12/2005 | Chujo et al. |
| 6,980,823 | B2 | 12/2005 | Challa et al. |
| 7,134,032 | B2 | 11/2006 | Yamada et al. |
| 2001/0023920 | A1 | 9/2001 | Ando et al. |
| 2002/0008326 | A1 | 1/2002 | Mizusaki |
| 2002/0101641 | A1 | 8/2002 | Kurchuk |
| 2002/0152408 | A1 | 10/2002 | Inui et al. |
| 2002/0179921 | A1 | 12/2002 | Cohn |
| 2003/0071283 | A1 | 4/2003 | Heschel |
| 2003/0089902 | A1 | 5/2003 | Yue |
| 2003/0116825 | A1 | 6/2003 | Geefay |
| 2003/0119308 | A1 | 6/2003 | Geefay |
| 2003/0142914 | A1 | 7/2003 | Jewell et al. |
| 2003/0160256 | A1 | 8/2003 | Durocher et al. |
| 2004/0086011 | A1 | 5/2004 | Bhandarkar |
| 2004/0190836 | A1 | 9/2004 | Kilian |
| 2005/0019042 | A1 | 1/2005 | Kaneda |
| 2005/0052255 | A1 | 3/2005 | Chiang |
| 2005/0058222 | A1 | 3/2005 | Black et al. |
| 2005/0134349 | A1 | 6/2005 | Krishnaswami |
| 2005/0191059 | A1 | 9/2005 | Swenson et al. |
| 2006/0115280 | A1 | 6/2006 | Chang |
| 2007/0019966 | A1 | 1/2007 | Chiu et al. |
| 2007/0047963 | A1 | 3/2007 | Dallesasse |
| 2007/0127929 | A1 | 6/2007 | Nishihara et al. |
| 2007/0154147 | A1 | 7/2007 | Weem |
| 2007/0154225 | A1 | 7/2007 | Schulz |
| 2007/0166047 | A1 | 7/2007 | Berger |
| 2007/0206964 | A1 | 9/2007 | Lee et al. |

FOREIGN PATENT DOCUMENTS

| | | |
|---|---|---|
| DE | 4440935 A1 | 5/1996 |
| DE | 19810624 | 3/1998 |
| DE | 19508222 | 6/1998 |
| DE | 19823691 | 12/1999 |
| DE | 10150401 | 10/2001 |
| EP | 0366974 A1 | 7/1989 |
| EP | 0713113 | 5/1996 |
| EP | 0942302 | 9/1999 |
| EP | 1104113 | 5/2001 |
| EP | 1187373 A2 | 3/2002 |
| EP | 1199697 | 4/2002 |
| EP | 1187373 A3 | 1/2005 |
| JP | 2007/020008 | 1/2007 |
| WO | WO-98/50810 A1 | 11/1998 |
| WO | WO-01/01497 | 1/2001 |

OTHER PUBLICATIONS

Agilent Technologies, Inc., "Gigabit Ethernet and Fibre Channel SerDes ICs", *Technical Data Sheet*, (Apr. 2000).

Lee, Chien C., et al., "Silicon-Based Transmissive Diffractive Optical Element", *Optics Letters, vol. 28, No. 14, Optical Society of America*, (Jul. 15, 2003), 1260-1262.

"German Office Action; involving counterpart German Patent Application", No. 10 2004 028 117, (Nov. 2, 2006),3-54.

"English translation of German Office Action; involving counterpart German Patent Application", No. 10 2004 028 117, (Nov. 2, 2006),3-54.

"German Office Action; involving counterpart German Patent Application", No. 10 2004 028 117, (Mar. 20, 2007),3-54.

"German translation of German Office Action; involving German Patent", No. 10 2004 028 117, (Mar. 20, 2007),3-54.

Pallotta, Andrea et al., "A Low-Power Clock and Data Recovery Circuit for 2.5 Gb/s SDH Receivers", *ISLPED, Rapallo, Italy*, (2000),67-72.

Takeshita, T. "A 622Mb/s Fully-Integrated Optical IC with a Wide Range Input", *IEEE, International Solid-State Circuits Conference*, (2002).

Sklar, B. "Digital Communications: Fundamentals and Applications", *2nd Ed., Upper Saddle River, NJ: Prentice Hall PTR*, (2001).

Pepeljugoski, P. et al., "Improved Performance of 10 Gb/s Multimode Fiber Optic Links Using Equalization", *Optical Fiber Communications Conference, OFC 2003, vol. 2*, (Mar. 23-28, 2003),472-474.

Kim, S.E. "CMOS Optical Receiver Chipset for Gigabit Ethernet Applications.", *Proceedings of the 2003 International Symposium on Circuits and Systems*, ISCAS '03, vol. 1: 1-29 to 1-32., (May 2003),25-28.

Sialm, et al., "Ultra-Fast CMOS Transceiver Design for Optical Interconnect Applications", Website: www.ife.ee.ethz.ch/rfic/ Link: 10 Gbit/s Optolink, (No Date).

* cited by examiner

US 7,413,917 B2

INTEGRATED OPTICS AND ELECTRONICS

FIELD OF INVENTION

This invention relates to a wafer-scale package for an optoelectronic device, and more specifically to a wafer-scale submount for an optoelectronic device.

DESCRIPTION OF RELATED ART

Optoelectronic (OE) devices are generally packaged as individual dies. This means of assembly is often slow and labor intensive, resulting in higher product cost. Thus, what is needed is a method to improve the packaging of OE devices.

SUMMARY

In one embodiment of the invention, an optoelectronic device includes a submount and a lid. The submount includes a lens and a laser above a substrate. The lid defines a cavity having a surface coated with a reflective material to form a 45 degree mirror. The mirror reflects a light from the laser to the lens and the light exits the optoelectronic device through the submount.

BRIEF DESCRIPTION OF THE DRAWINGS

Use of the same reference symbols in different figures indicates similar or identical items. The cross-sectional figures are not drawn to scale and are only for illustrative purposes.

DETAILED DESCRIPTION

An optoelectronic package may include a submount wafer, a ring wafer bonded to the submount wafer, and a lid wafer bonded to the ring wafer. The lid wafer typically includes an integrated lens. The submount wafer typically includes an edge-emitting laser and interconnects for powering the laser. The ring wafer is typically processed using RIE etching to form straight walls. An additional component that has a 45 degree surface is placed next to the laser inside the ring. This component acts as a mirror to reflect the light from the laser up through the lens in the lid. Alternatively, the ring wafer is processed to form an integrated 45 degree mirror that reflects the light from the laser up through the lens in the lid wafer.

The optoelectronic package requires two hermetic seals: one between the ring wafer and the lid wafer, and another between the ring wafer and the submount wafer. In the case where there is an additional mirror component, that too has to be aligned and attached. The optoelectronic package also requires three wafers to be processed. Additionally, to maintain the correct path length, it is necessary to use two thin wafers (e.g., 275 microns) for the ring wafer and the lid/lens wafer. Thus, what is needed is an apparatus that addresses these disadvantages of the optoelectronic package.

Integrated Optics and Electronics

Figure 1:
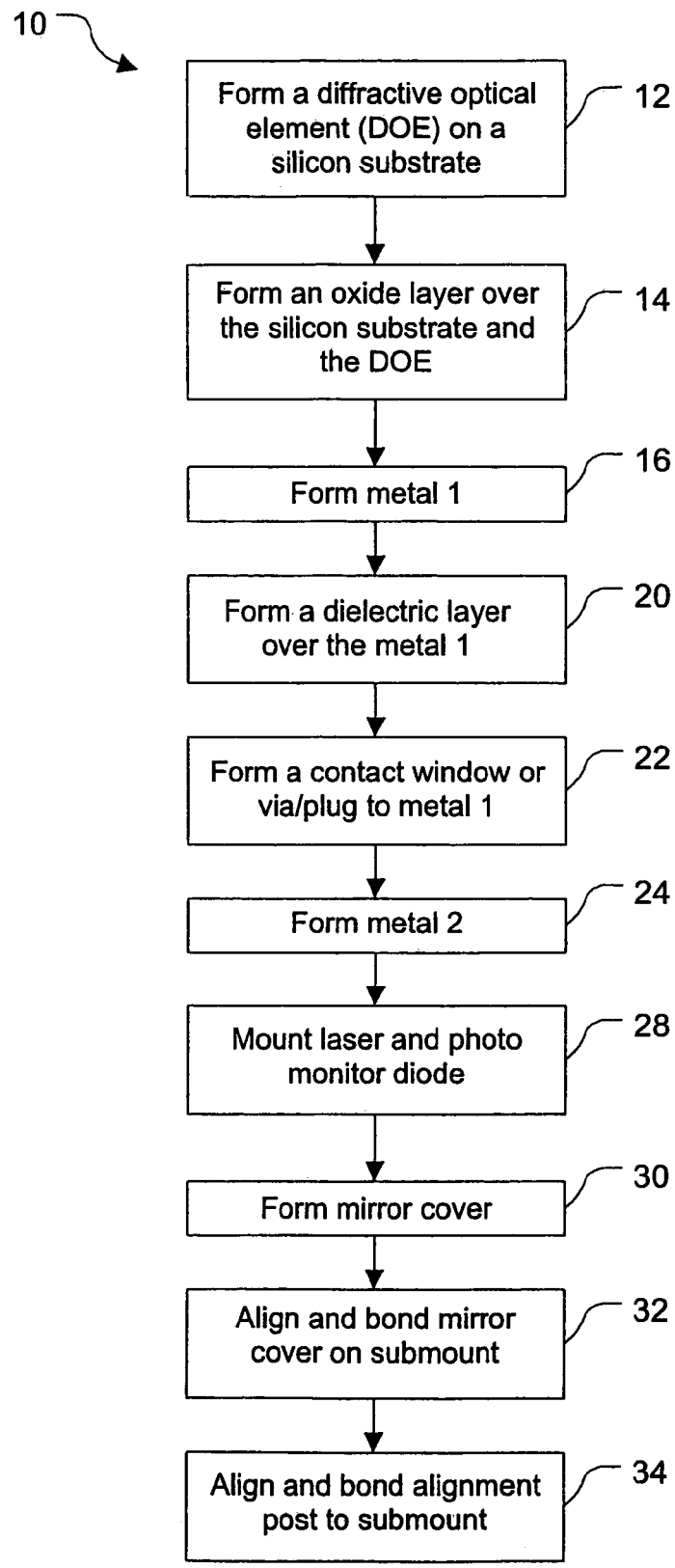
FIG. 1 is a flowchart of a method 10 for making an optoelectronic device including a submount, a lid, and an alignment post in one embodiment of the invention.

FIG. 1 is a flowchart of a method 10 for making an optoelectronic chip enclosure (OECE) 150 (FIG. 16) including a laser submount 80 and a lid 130 in one embodiment of the invention.

Figure 2:
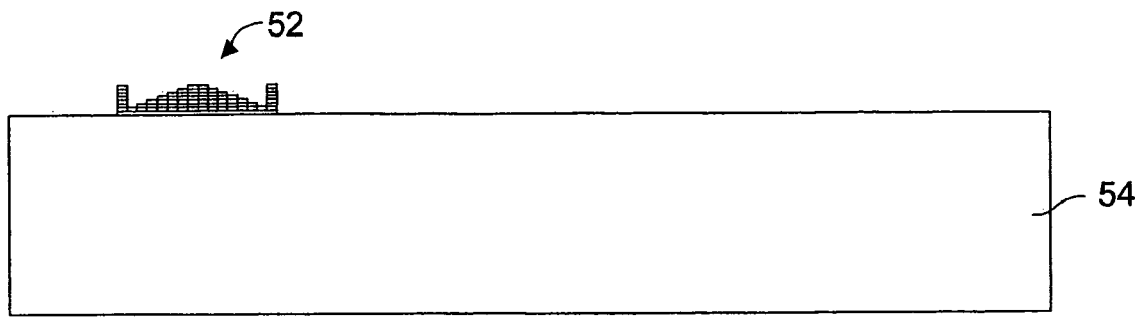
FIGS. 2, 3, 4, 5, 6, 7, 8, 9, 10, 11, 12, and 13 illustrate the cross-sections of the submount formed with method 10 in one embodiment of the invention.

In step 12, as illustrated in FIG. 2, an optical lens 52 is formed atop a substrate 54 of submount 80. In one embodiment, substrate 54 is a silicon wafer of a standard thickness (e.g., 675 microns) that is transparent to 1310 nanometer (nm) light. Alternatively, substrate 54 can be quartz, sodium borosilicate glass (e.g., Pyrex®), sapphire, gallium arsenide, silicon carbide, or gallium phosphide. In one embodiment, lens 52 is a diffractive optical element (DOE) patterned from a stack of phase shifting lens layers to form the desired lens shape. Adjacent phase shifting layers in the stack are separated by one etch stop layer. The phase shifting layers can be amorphous silicon (α-Si) and the etch stop layers can be silicon dioxide (SiO2). Alternatively, the phase shifting layers can be silicon nitride (Si3N4) instead of amorphous silicon.

To form the stack, an amorphous silicon layer is first formed on substrate 54. The amorphous silicon layer can be deposited by low pressure chemical vapor deposition (LPCVD) at 550° C. or by plasma enhanced chemical vapor deposition (PECVD). The thickness of the amorphous silicon layer can be determined by the following formula:

$$t = \frac{\lambda}{N(\Delta n_i)}.$$

In the above equation, t is the thickness of the phase shifting lens layer, λ is the target wavelength, N is the number of the phase shifting lens layer, and $\Delta n_i$ is the difference in the refractive index ($n_i$) between the phase shifting lens material and it's surrounding. In one embodiment where λ is 1310 nm, N is eight, $n_i$ of amorphous silicon is 3.6, and $n_i$ of silicon dioxide is 1.46, the amorphous silicon layer has a typical thickness of 765 angstroms.

A silicon dioxide (SiO2) layer is next formed on the amorphous silicon layer. The silicon dioxide layer can be thermally grown on the amorphous silicon layer in steam at 550° C.

Alternatively, silicon dioxide layer can be deposited by PECVD. The silicon dioxide layer has a typical thickness of 50 angstroms. The process of depositing amorphous silicon and low temperature thermal oxidation of the amorphous silicon is repeated for the desired number of phase shifting layers.

Once the stack is formed, each layer is masked and etched to form the desired diffractive lens. The silicon dioxide layer on the top amorphous silicon layer is first dipped off using a diluted water/hydrofluoric acid (HF) solution (typically 50:1). A photoresist is next spun, exposed, and developed on the amorphous silicon layer. The amorphous silicon layer is then plasma etched down to the next silicon dioxide layer, which acts as the etch stop. The process of masking and etching is repeated for the remaining phase shifting layers.

In one embodiment, lens 52 is a bifocal diffractive lens that converts laser light into a small angle distribution that is spread uniformly throughout a volume. The volume's dimensions are large relative to the size of the input face of an optical fiber so the components can easily align. The bifocal diffractive lens has a surface with ridges that provide two focal lengths f1 and f2. A design process for the bifocal diffractive lens can begin with determining the first phase function that defines a surface contour for a conventional diffractive lens having focal length f1. Any conventional techniques for diffractive lens design can be used. In particular, commercial software such as GLAD from Applied Optics Research, Inc. or DIFFRACT from MM Research, Inc. can analyze the phase functions of diffractive elements. A second phase function is similarly generated, wherein the second phase function is such that if the second phase function were multiplexed together with the first phase function, the combination would provide a diffractive lens having the second focal length f2. The second phase function is then scaled so as to provide a partially efficient diffractive lens that focuses a percentage (e.g., 50%) of the incident light but passes the remainder (e.g., 50%) of the incident light unperturbed. The first phase function and the scaled second phase function are multiplexed together to form a final bifocal lens design.

In another embodiment, lens 52 is a hybrid diffractive/refractive element. The hybrid diffractive/refractive element spreads the light over a volume to expand the alignment tolerance for an optical fiber as described above. The hybrid diffractive/refractive lens has at least one surface with a curvature for one focal length, e.g., f2. Further, diffractive features of a partially efficient diffractive lens are superimposed on one or both surfaces of hybrid diffractive/refractive lens so that the combination provides two focal length f1 and f2 for seperate fractions of the incidence light.

Figure 3:
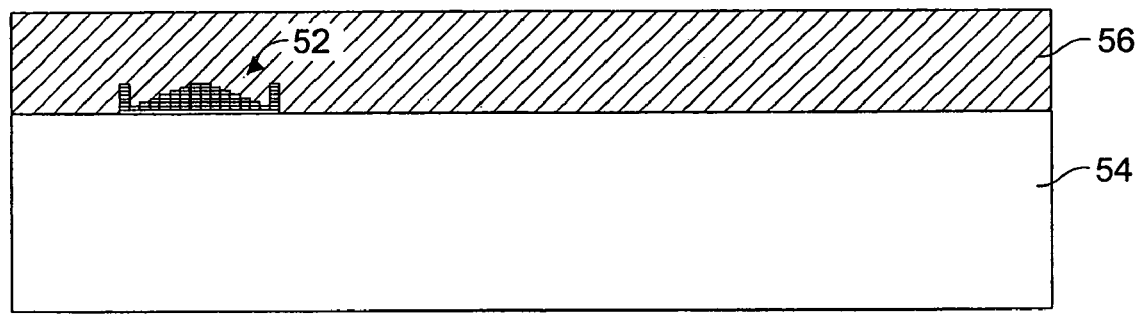

In step 14, as illustrated in FIG. 3, an oxide layer 56 is formed over substrate 54 and lens 52. In one embodiment, oxide layer 56 is silicon dioxide deposited by PECVD and has a typical thickness of 1 micron. Oxide layer 56 is later planarized to provide a flat surface for light to go through. This can be done at the end of the process after metal layers are formed.

Figure 4:
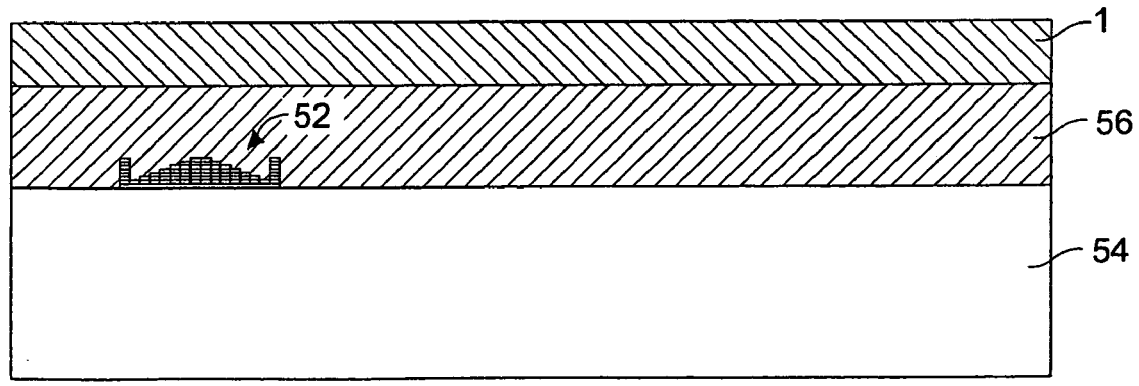
Figure 5:
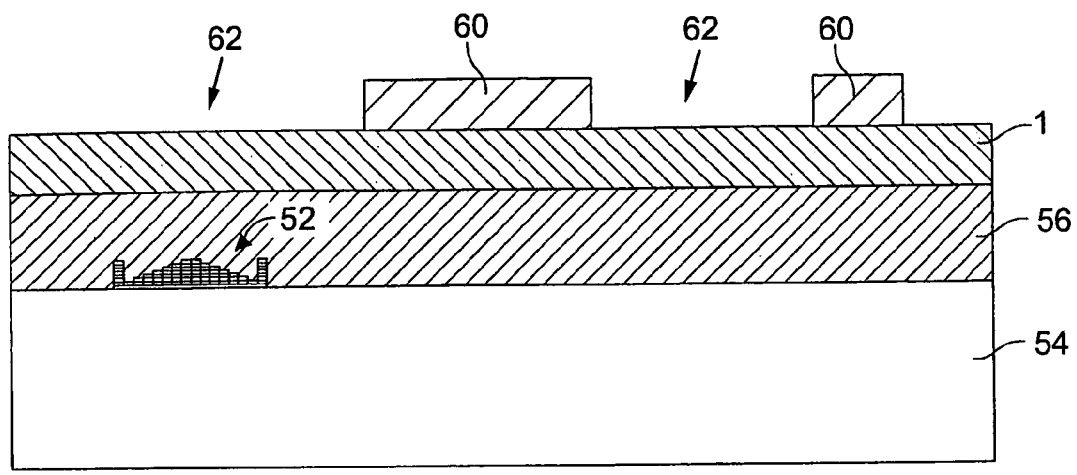
Figure 6:
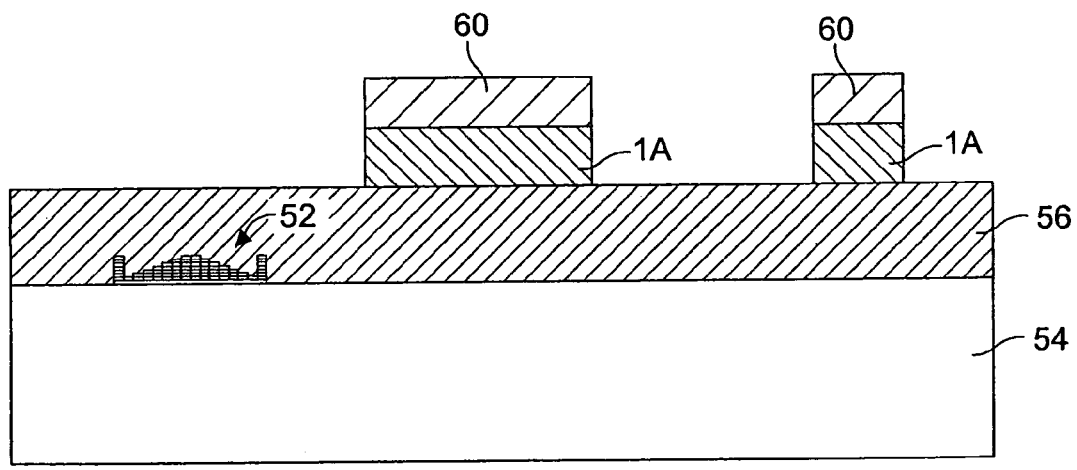

In step 16, as illustrated in FIGS. 4 to 6, a metal layer 1 is formed over oxide layer 56 and then patterned. In one embodiment, metal layer 1 (FIG. 4) is a stack of titanium-tungsten (TiW), aluminum-copper (AlCu), and TiW metals deposited by sputtering. The TiW alloy layers are typically each 0.1 micron thick while AlCu alloy layer is typically 0.8 micron thick. Metal layer 1 is patterned to form interconnects. In one embodiment, a photoresist is spun, exposed, and developed to form an etch mask 60 (FIG. 5) defining etch windows 62 (FIG. 5). Portions of metal layer 1 exposed by etch windows 62 are then etched to form interconnects 1A (FIG. 6). Afterwards mask 60 is stripped from interconnects 1A.

Figure 7:
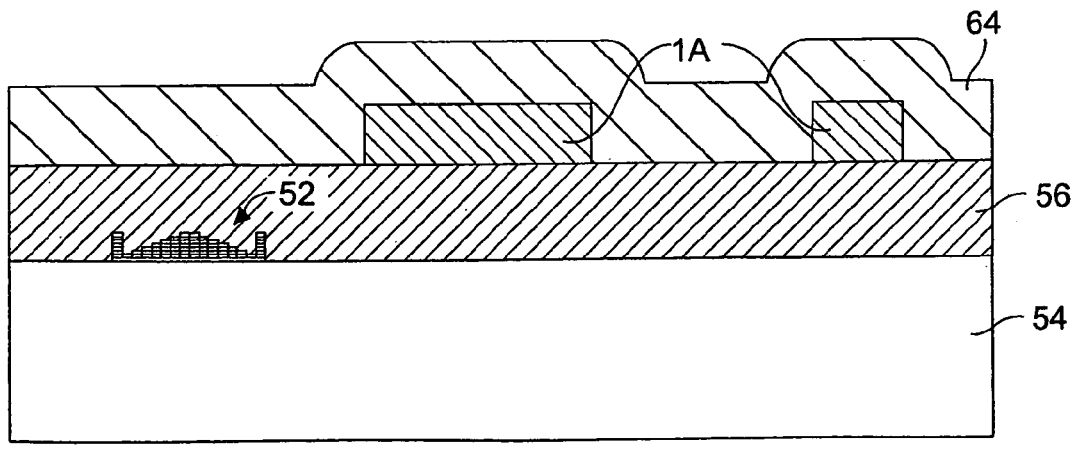
Figure 8:
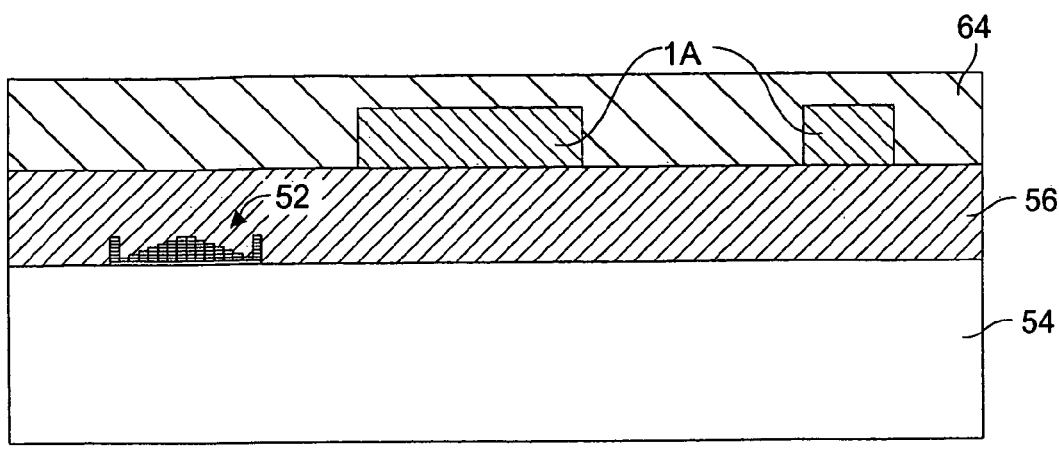

In step 20, as illustrated in FIGS. 7 and 8, a dielectric layer 64 is formed over oxide layer 56 and interconnects 1A and then planarized. Dielectric layer 64 insulates interconnects 1A from other conductive layers. In one embodiment, dielectric layer 64 is silicon dioxide made from tetraethyl orthosilicate (TEOS) formed by PECVD and planarized by chemical mechanical polishing (CMP). Dielectric layer 64 has a typical thickness of 1 micron.

Figure 9:
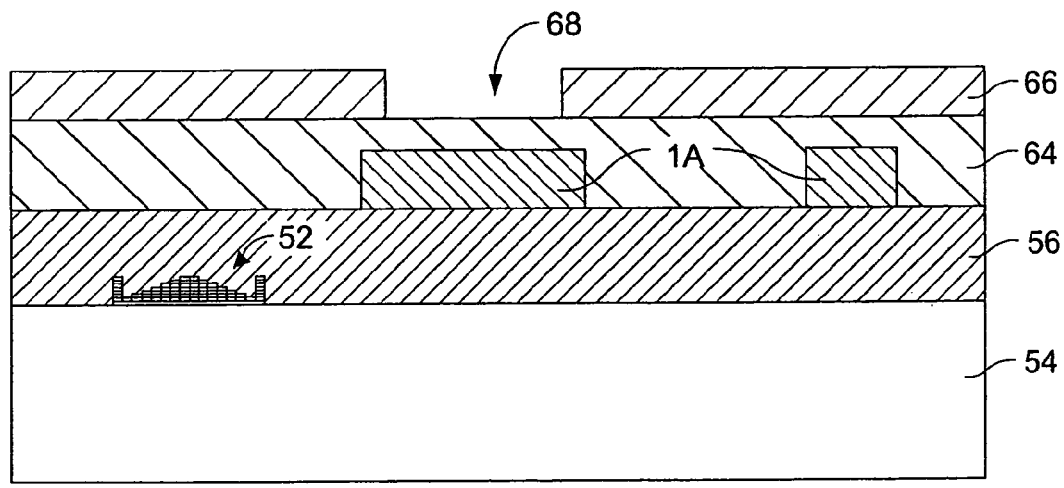
Figure 10:
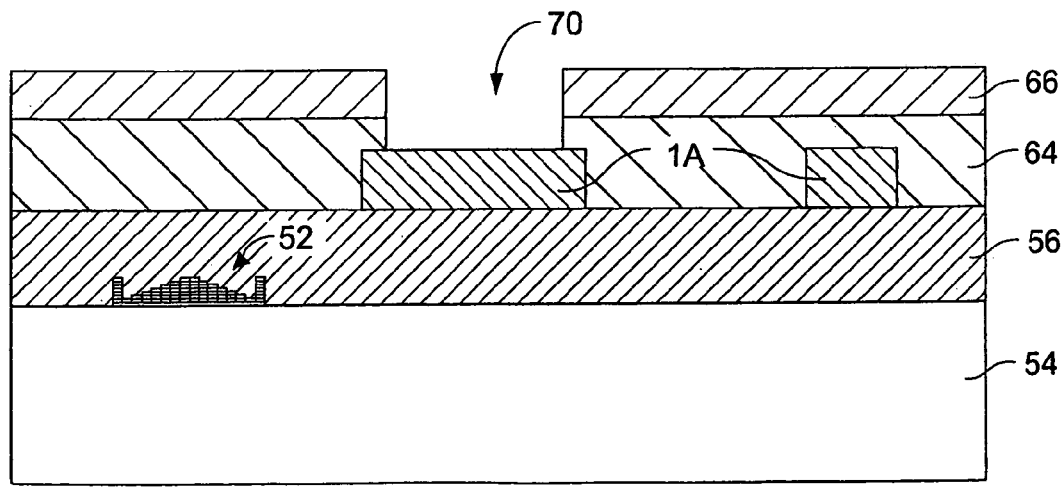

In step 22, as illustrated in FIGS. 9 and 10, a contact window or via 70 to interconnect 1A is formed. In one embodiment, a photoresist is spun, exposed, and developed to form an etch mask 66 (FIG. 9) defining an etch window 68 (FIG. 9). A portion of dielectric layer 64 exposed by etch window 68 is then etched to form contact window/via 70 (FIG. 10). Afterwards mask 66 is stripped from interconnects 1A. A metal can be deposited in via 70 to form a plug to interconnect 1A.

Figure 11:
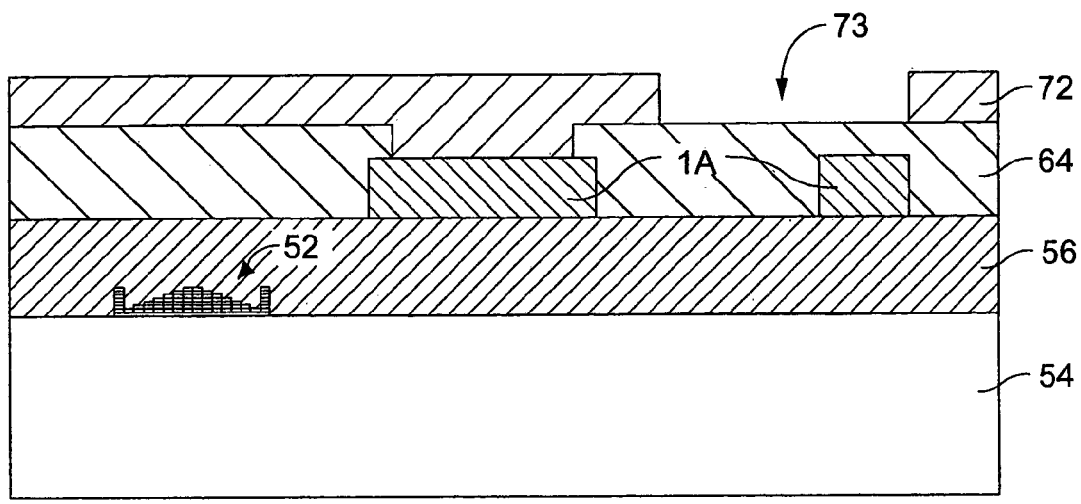
Figure 12:
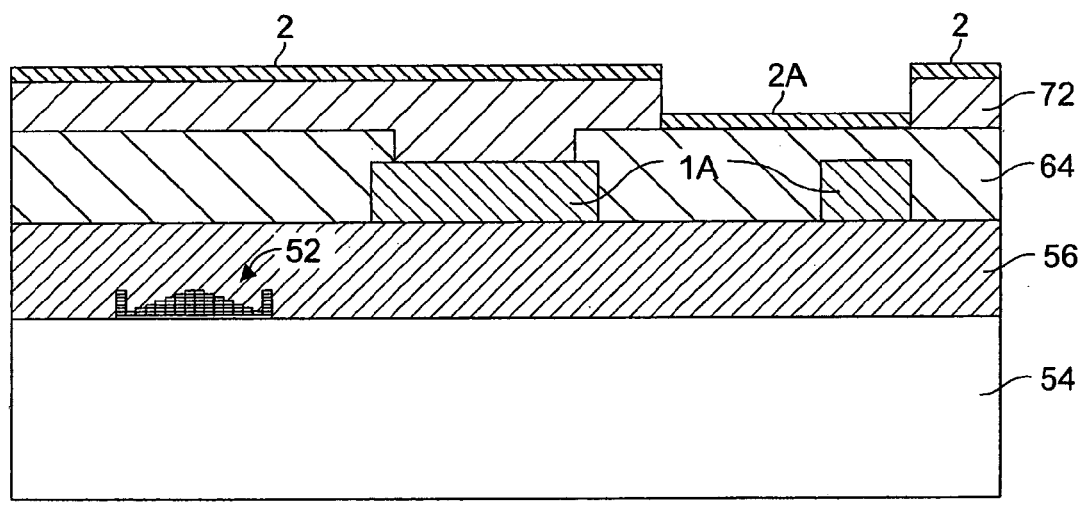
Figure 13:
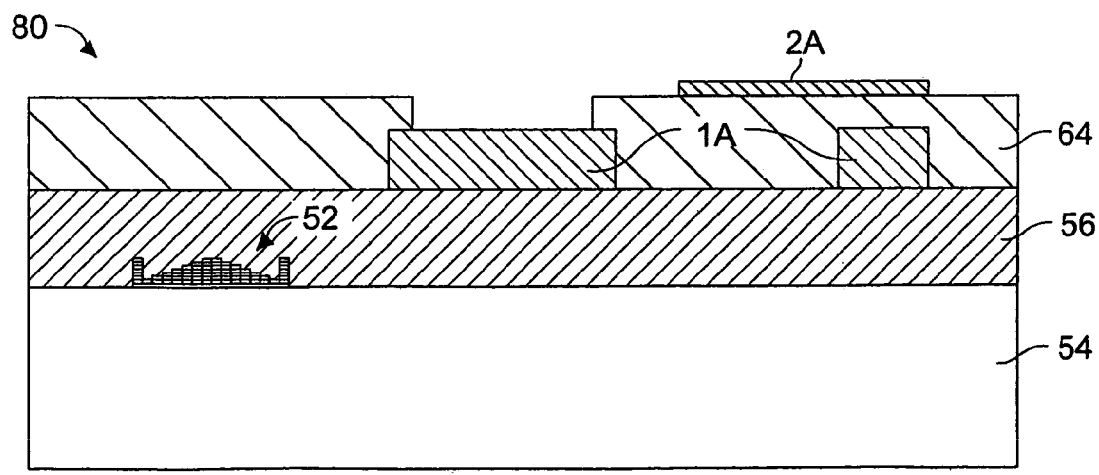

In step 24, as illustrated in FIGS. 11 to 13, a metal layer 2 is formed over dielectric layer 64. In one embodiment, metal layer 2 is titanium-platinum-gold (TiPtAu) sequence deposited by evaporation. Titanium has a typical thickness of 0.1 micron, platinum has a typical thickness of 0.1 micron, and gold has a typical thickness of 0.5 micron. Metal layer 2 is formed to form contact pads and bonding pads. In one embodiment, a photoresist is spun, exposed, and developed to form a liftoff mask 72 (FIG. 11) defining a deposit window 73 (FIG. 11). Metal layer 2 (FIG. 12) is then deposited over liftoff mask 72 and through window 73 onto dielectric layer 64. Afterwards mask 72 is stripped to liftoff metal layer 2 deposited over mask 72 and leaving behind contact pad or bonding pad 2A (FIG. 13).

Figure 14:
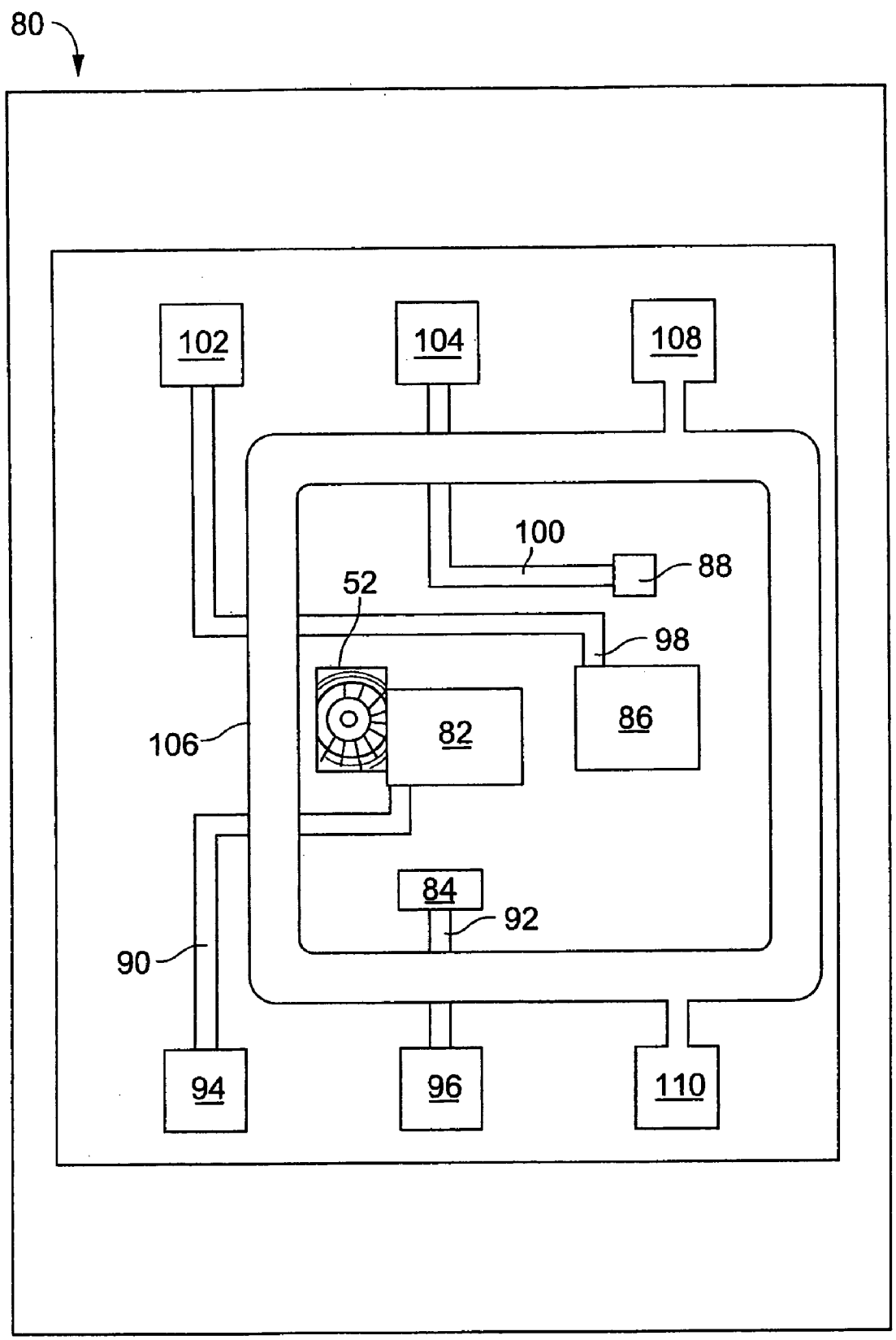
FIG. 14 illustrates a top view of the submount formed with method 10 in one embodiment of the invention.
Figure 15:
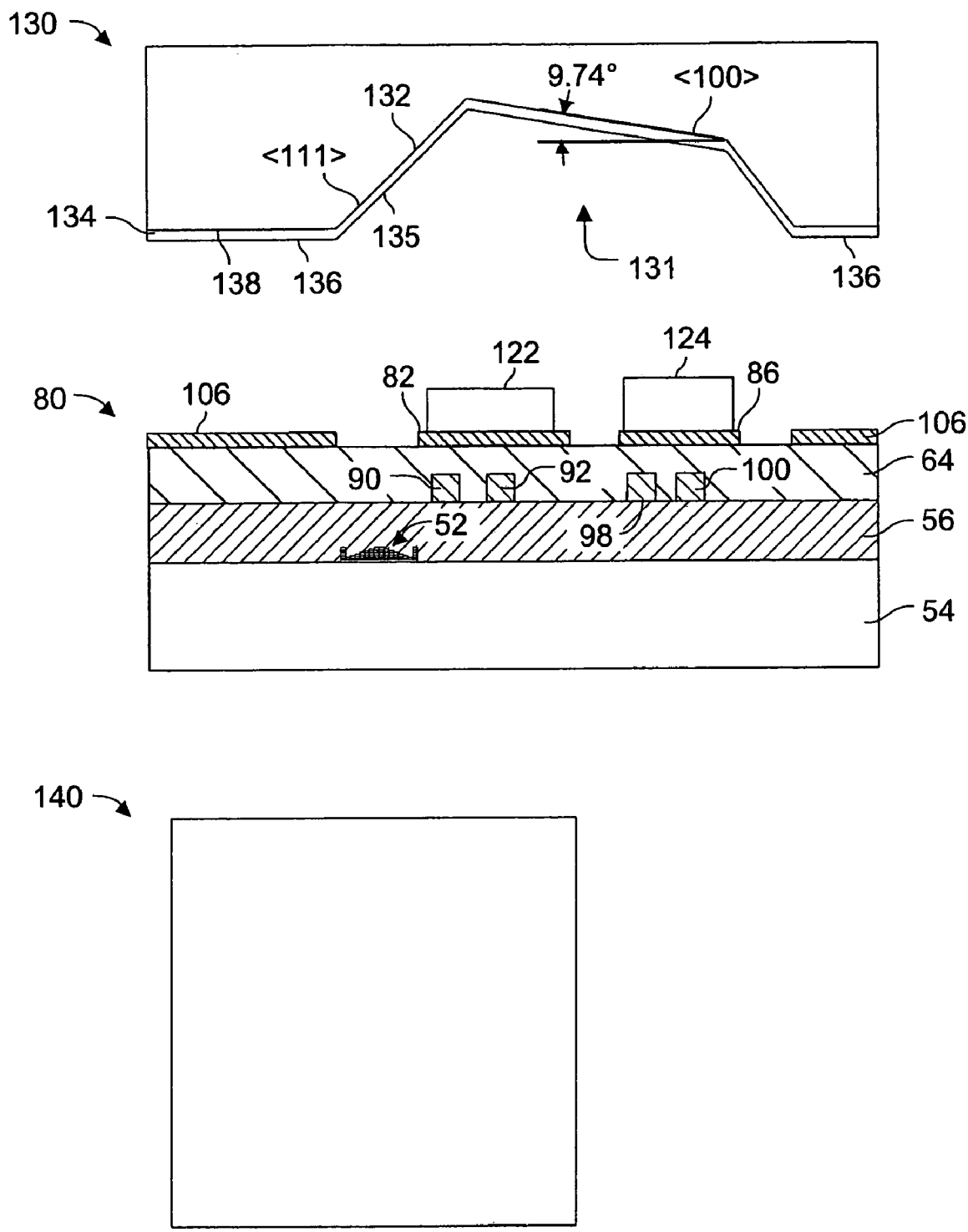
FIG. 15 illustrates an exploded view of the optoelectronic device in one embodiment of the invention.

Metal layers 1 and 2 can be patterned to form 2 interconnect levels. The two interconnect levels can be connected by plugs in between the two levels. FIG. 14 illustrates a top view of submount 80 formed at this point of method 10 in one embodiment. Submount 80 includes a seal ring 106 that forms a perimeter around lens 52 and contact pads 82, 84, 86, and 88. Seal ring 106 is used to bond submount 80 to a lid that encloses lens 52, a laser die 122 (FIG. 15), and a monitor photodiode die 124 (FIG. 15). Seal ring 106 is part of metal layer 2 formed and patterned in step 24. Seal ring 106 is coupled to bonding pads 108 and 110, which provide a ground connection. When seal ring 106 is later electrically coupled to a metal covered lid 130, the metal will serve as an electromagnetic interference (EMI) shield so that EMI cannot exit through the lid 130.

Contact pads 82 and 84 provide electrical connections to laser die 122. Contact pads 82 and 84 are connected by respective buried traces 90 and 92 to respective contact pads 94 and 96 located outside seal ring 106. Contact pads 82 and 84 are part of metal layer 2 formed and patterned in step 24. Traces 90 and 92 are part of metal layer 1 formed and patterned in step 16.

Contact pads 86 and 88 provide electrical connection to monitor photodiode die 124. Contact pads 86 and 88 are connected by respective buried traces 98 and 100 to respective contact pads 102 and 104 located outside seal ring 106. Contact pads 86 and 88 are part of metal layer 2 formed and patterned in step 24. Traces 98 and 100 are part of metal layer 1 formed and patterned in step 16.

In step 28, as illustrated in FIG. 15, laser die 122 is aligned and bonded to contact pad 82. Laser die 122 is also electrically connected to contact pad 84 (FIG. 14) by a wire bond. In one embodiment, laser die 122 is an edge-emitting Fabry Perot laser. Similarly, monitor photodiode die 124 is aligned and bonded to contact pad 86. Monitor photodiode die 124 is also electrically connected to contact pad 88 by a wire bond. After laser die 122 and photodiode die 124 are attached, an antireflective coating (not shown) can be applied to the surface over lens 52 to reduce reflection as light exits submount 80.

In step 30, as illustrated in FIG. 15, a lid 130 is formed. Lid 130 defines a cavity 131 having a surface 132 covered by a reflective material 134. Cavity 131 provides the necessary space to accommodate dies that are on submount 80. Reflective material 134 on surface 132 forms a 45 degree mirror 135 that reflects a light from laser die 122 to lens 52. Reflective material 134 at the edge of lid 130 also acts as a seal ring 136. Reflective material 134 over cavity 131 also serves as an EMI shield when it is grounded through contact between seal rings 136 and 106, the latter being grounded through contact pads 108 and 110. In one embodiment, reflective material 134 is titanium-platinum-gold(TiPtAu) sequence deposited by evaporation. Titanium has a typical thickness of 0.1 micron, platinum has a typical thickness of 0.1 micron, and gold has a typical thickness of 0.1 micron. In one embodiment, lid 130 is a silicon wafer of a standard thickness (e.g., 675, microns) that is transparent to 1310 nm light.

In one embodiment, lid 130 has a <100> plane at a 9.74 degree offset from a major surface 138. Lid 130 is wet etched so that surface 132 forms along a <111> plane of the silicon substrate. As the <100> plane of lid 130 is at a 9.74 degree offset from major surface 138, then the <111> plane and mirror 135 are oriented at a 45 degree offset from major surface 138.

Figure 16:
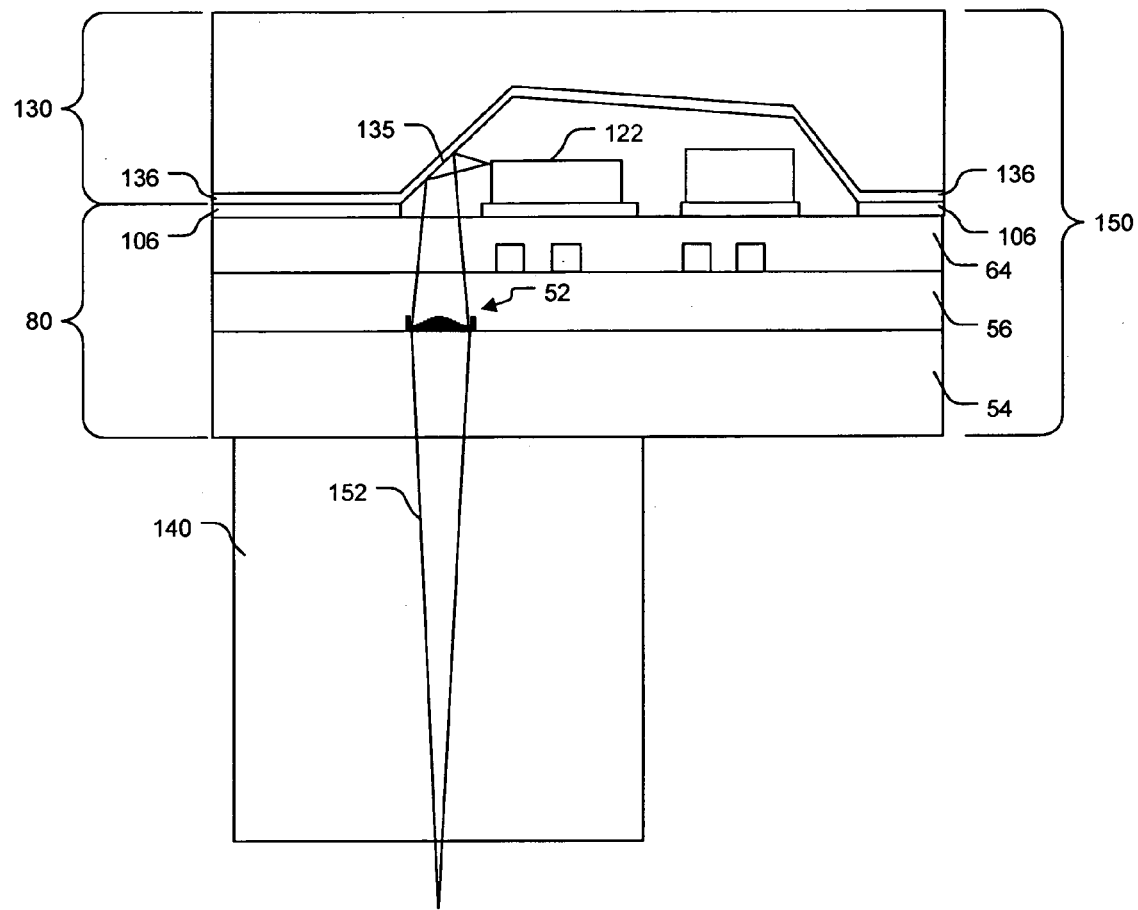
FIG. 16 illustrates an assembled view of the optoelectronic device in one embodiment of the invention.

In step 32, as illustrated in FIG. 16, lid 130 is aligned and bonded to the topside of submount 80 to form OECE 150. In one embodiment, seal ring 136 of lid 130 and seal ring 106 of submount 80 are bonded by solder. Alternatively, seal ring 136 of lid 130 and seal ring 106 of submount 80 are bonded by a cold weld.

As can be seen, a light 152 (e.g., 1310 nm) is emitted by laser die 122. Light 152 is reflected from mirror 135 downwards to lens 52. Lens 52 then focuses light 152 so it can be received by an optical fiber at a specified location. As insulator layer 64, oxide layer 56, and substrate 54 are transparent to light 152, light 152 can exit OECE 150 through submount 80.

In step 34, as illustrated in FIG. 16, an alignment post 140 is aligned and bonded to the backside of submount 80. Alignment post 140 allows OECE 150 to be aligned with an optical fiber in a ferrule.

As one skilled in the art understands, the process described above can be performed on a wafer-scale so that numerous OECEs 150 are formed simultaneously. These OECEs 150 are then singulated to form individual packages.

OECE 150 offers several advantages over the conventional optoelectronic package. First, only two wafers are needed to make OECE 150 instead of three wafers for a conventional package. Second, the wafers can be of standard thickness (e.g., 675 microns) instead of two thin wafers for a conventional package. Third, only one hermetic seal is needed between lid 130 and submount 80 instead of two for a conventional package.

Alignment Post for Optical Subassemblies

Figure 17:
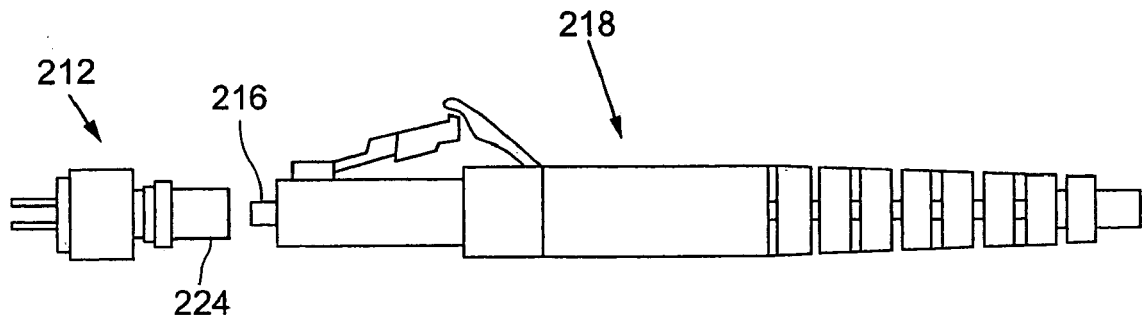
FIGS. 17 and 18 illustrate a conventional optical subassembly (OSA) and a conventional LC connector.

FIG. 17 illustrates a conventional optical subassembly (OSA) 212, which is a common building block in the manufacture of fiber optic (FO) transceivers. OSA 212 converts electrical signals to optical signals and launches these pulses of light into an optical waveguide 214 (FIG. 18) such as a fiber. Typically, fiber 214 is mounted in a ceramic ferrule 216 that is contained in a connector body 218. Connector body 218 can be a small-form-factor (SFF) FO connector such as the Lucent connector, commonly known as the LC connector, developed by Lucent Technologies. Other types of FO connectors, such as the SC connector, the ST connector, and the FC connector, can also be used.

Figure 18:
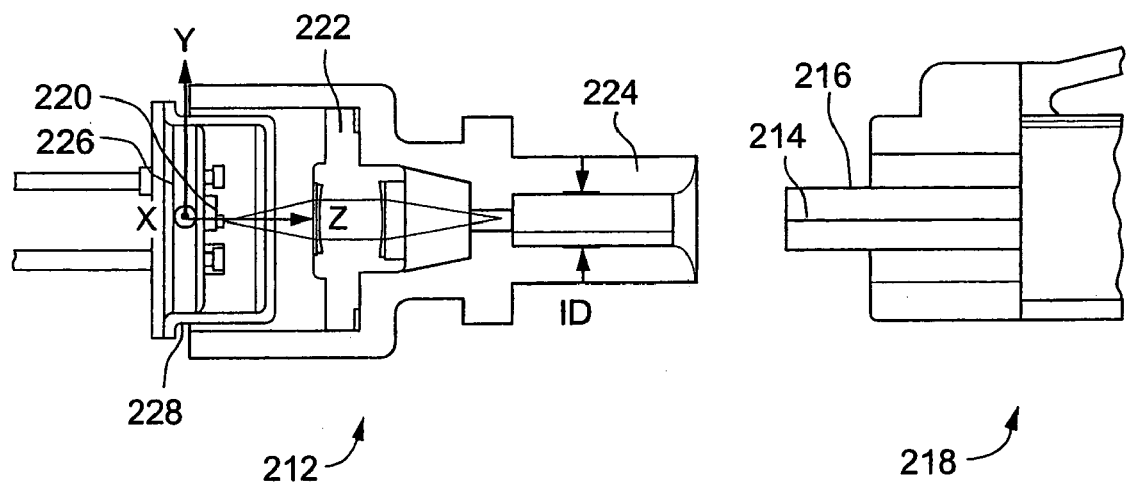

FIG. 18 illustrates the details of OSA 212. Typically OSA 212 includes three elements that need to be optically aligned: (1) an optoelectronic (OE) device 220, (2) a lens 222, and (3) a port 224 that accepts ferrule 216 containing fiber 214. Generally OE device 220 is mounted on a TO (transistor outline) header 226 and packaged in a windowed TO can 228. Port 224 is part of a body that receives TO can 228 and lens 222. These three elements normally must be aligned within a few microns of their ideal positions relative to each other.

OSA 212 is not complete and testable until its elements have been aligned and fixed into their proper positions. This alignment is usually accomplished by powering OE device 220 and moving TO can 228 in X, Y, and Z directions relative to port 224. This alignment is then "fixed," generally either with a polymer adhesive or by a laser-welding process.

OSA designs vary significantly from product to product but they usually involve a packaged device (e.g., OE device 220), a lens (e.g., lenses 222), and a fiber alignment feature (e.g., port 224). The fiber alignment feature is usually a precision hole fabricated with injection-molded plastic or ceramic to accept a ceramic ferrule (e.g., ferrule 216).

There is a continuous push to manufacture smaller and cheaper OSAs. There are many good reasons related to cost, quality, and functionality for wanting a small OSA. However, the small OSA is not complete until it includes an alignment feature. Thus, what is needed is an alignment feature for small OSAs.

Figure 19:
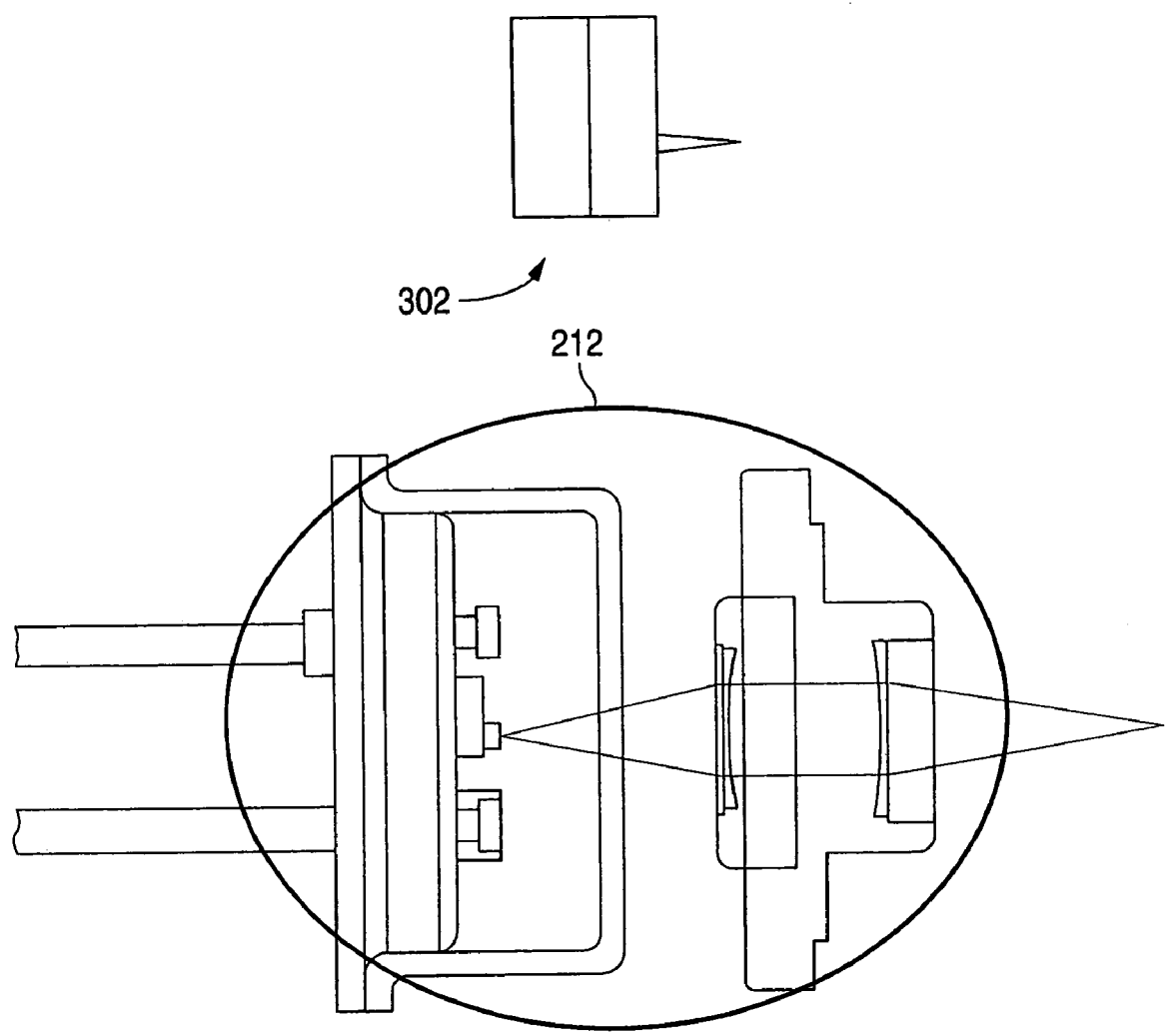
FIG. 19 illustrates a comparison between an optoelectronic chip enclosure (OECE) in one embodiment of the invention and the corresponding elements in a conventional OSA.

FIG. 19 illustrates an OECE 302 in comparison to the corresponding parts in conventional OSA 212. OECE 302 requires an alignment feature that is both inexpensive and appropriately sized to match the package. One method would be to align and attach OECE 302 to a part with a precision hole (e.g., a port). However, this solution has serious drawbacks since the port is necessarily much larger than OECE 302 and therefore a testable, aligned OSA would be much larger than OECE 302.

Figure 20A:
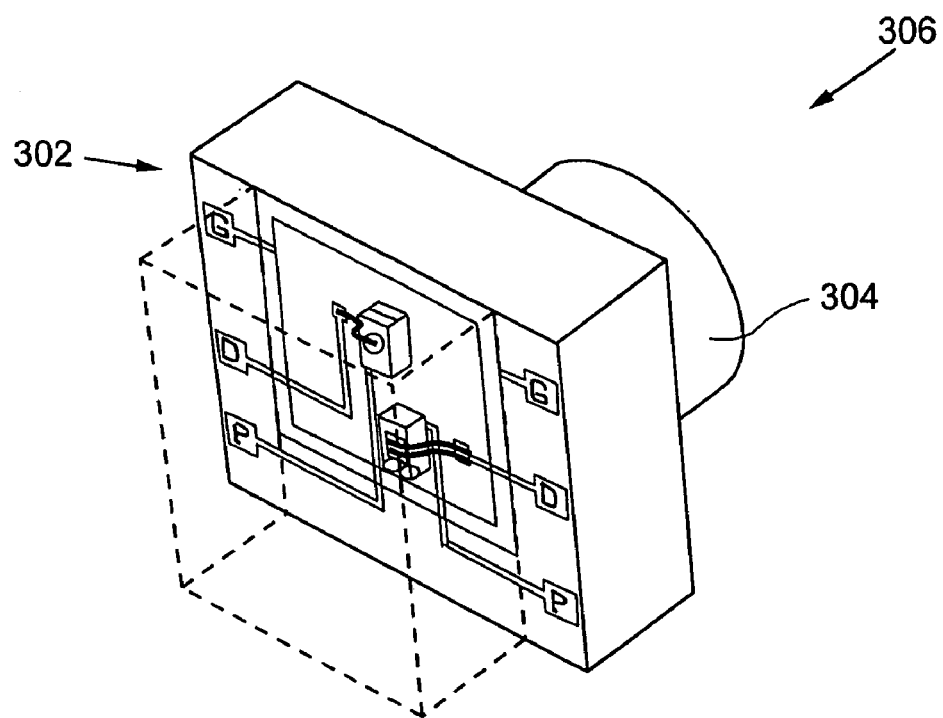
FIGS. 20A and 20B illustrate an OECE utilizing an alignment post in one embodiment of the invention.
Figure 20B:
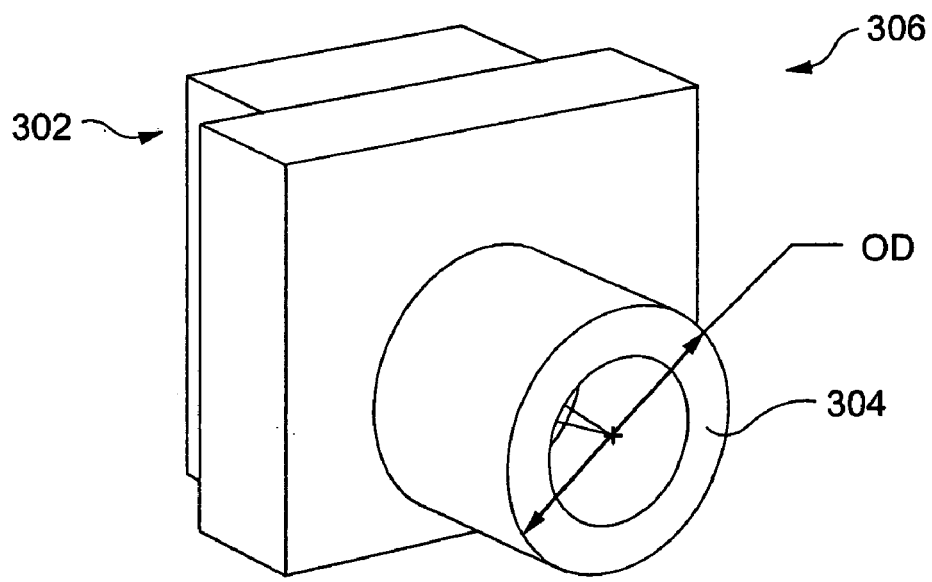

FIGS. 20A and 20B illustrate OECE 302 with an alignment post 304 in one embodiment of the invention. Alignment post 304 is a cylindrical tube aligned and attached to the front "window" of OECE 302. The result is a completely aligned and testable OSA 306. By adding alignment post 304 to the front window of OECE 302, a completely aligned OSA 306 can be created within the "footprint" of OECE 302.

Figure 21:
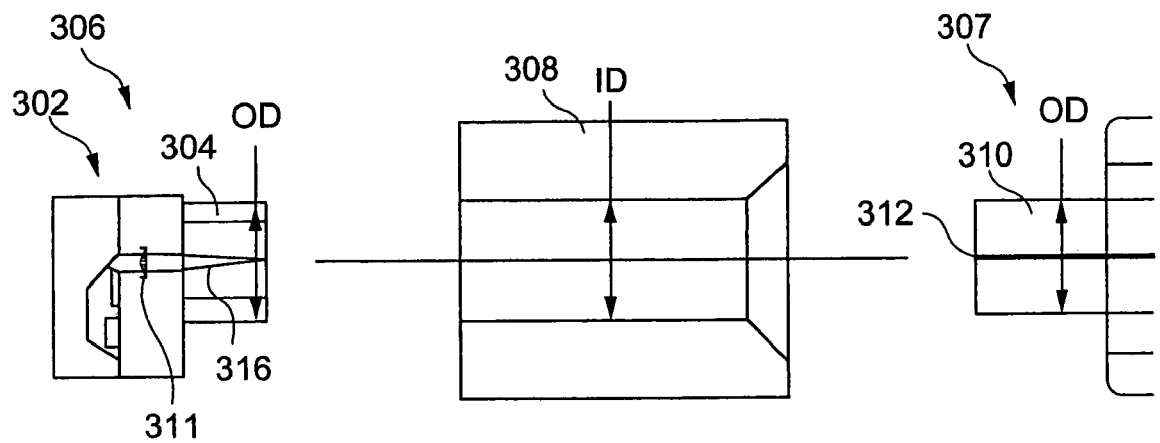
FIG. 21 illustrates the alignment of the OSA of FIGS. 20A and 20B and a fiber optic connector in one embodiment of the invention.

FIG. 21 illustrates the assembly of OSA 306 and an FO connector 307 in one embodiment of the invention. FO connector 307 can be an LC connector, a SC connector, a ST connector, a FC connector, or other similar FO connectors. Alignment post 304 on a fully aligned OSA 306 is inserted into one end of a sleeve 308 made from plastic, metal or ceramic. This subassembly of OSA 306 and sleeve 308 forms part of a fiber optic module that would mate with a fiber optic cable, such as a fiber 312 in FO connector 307, supplied by the user. A ceramic ferrule 310 carrying fiber 312 is inserted in another end of sleeve 308. Sleeve 308 is made with the proper inner diameter(ID) to accept the outer diameter(OD) of alignment post 304 and ferrule 310. The insertion of the OSA 306 into sleeve 308 would be entirely passive, and therefore low cost operation.

It is important to note that although alignment post 304 may look similar to port 224 (FIG. 18) on conventional OSA 212 (FIG. 18), it is fundamentally different because the alignment feature on alignment post 304 is the OD and the alignment feature on port 224 is the ID. Referring to FIG. 17, the ID of port 224 is normally a few microns larger than the OD of the mating ferrule 216. Port 224 may have a 1.255 mm ID to mate with a 1.249 mm OD of ferrule 216. Referring to FIG. 21, alignment post 304 has the same or similar OD (e.g., 1.25 mm) as ferrule 310. The optical distance from lens 311 of OECE 302 to fiber 312 would be set by the length of alignment post 304. The hole in the center of alignment post 304 is not used for alignment but only to allow light 316 to pass through. Thus, the size the hole is not critical. The dimensions in the above description are typical for launching light into multi-mode fibers. The concepts described is also applicable to OSAs for launch into single-mode fibers but the tolerances required for single-mode fibers may be tighter than those required for multi-mode launch.

The concept of aligning to an OD (i.e., to a post) is subtly different from aligning to an ID (i.e., to a hole) but offers two key advantages: cost and size.

Cost—It is very easy and economical to manufacture posts with a precision diameter. This is because a long rod can be made by grinding the OD and then many parts can be made by simply slicing off pieces of the rod. The cost of making a precision feature with perhaps a micron or two of tolerance is important to keeping the cost of OSA 306 to a minimum. The cheapest precision feature one can make is a sphere (e.g., a ball bearing) and probably the second cheapest precision feature is a cylinder.

Size—OECE 302 can be manufactured in a two-dimensional array of parts. This manufacturing method would produce hundreds or even thousands of OSAs 306 complete except for the alignment features. Ideally, the alignment features would be added while the OSAs 306 are still in array form but this will only be possible if the alignment feature is smaller than the footprint of OECE 302.

Figure 22A:
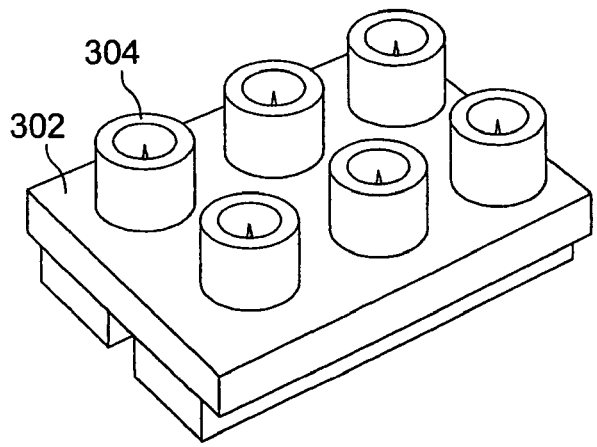
FIGS. 22A and 22B illustrate the advantages of using an alignment post over an alignment port in one embodiment of the invention.
Figure 22B:
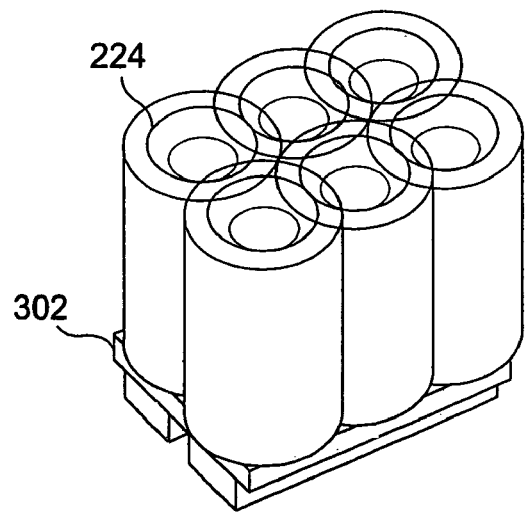

FIG. 22A illustrates that alignment posts 304 can be aligned and attached (individually or as a group) to an array of OECEs 302. Alignment post 304 is small enough so it fits on the front window of OECE 302. On the other hand, FIG. 22B illustrates that ports 224 cannot be aligned and attached to an array of OECEs 302 without increasing the spacing and therefore the size (and therefore the cost) of OECEs 302.

Figure 23:
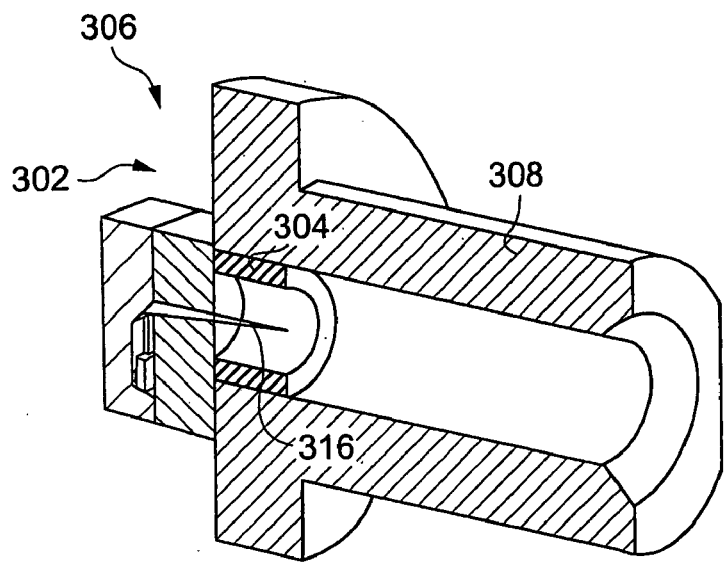
FIG. 23 illustrates an OECE with a cylindrical alignment post inserted into a sleeve in one embodiment of the invention.

FIG. 23 illustrates a cross-section of an OSA 306 inserted into a sleeve 308 in one embodiment. An array of OSAs 306 may need to be singulated before each can be inserted into sleeve 308 or anything that is much larger. However, the singulation at this point is not a disadvantage in the manufacturing of OSAs 306 because alignment posts 304 have already been aligned and attached to OECEs 302 in its array form.

Another advantage of a small OSA 306 is that it can be aligned closer together with another OSA 306 to mate with new smaller FO connectors. In fact, one of the historical reasons for the current size of duplex connectors (such as the duplex LC connectors) goes back to how close together two TO cans can be aligned into ports. OSA 306 would thus allow for smaller connectors and smaller transceivers.

Figure 24:
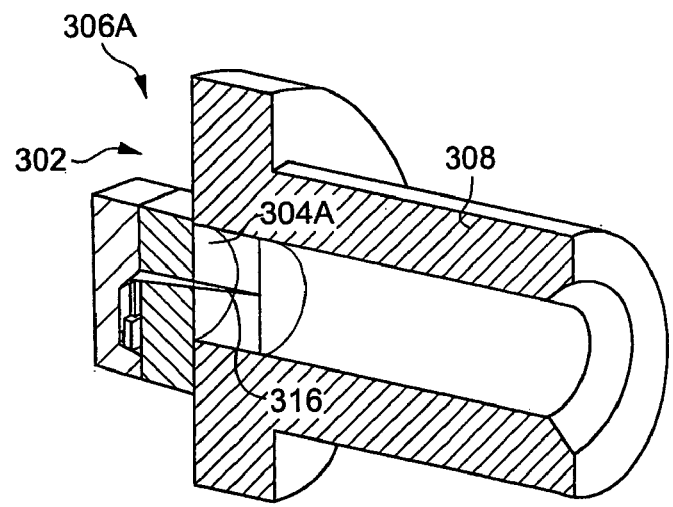
FIG. 24 illustrates an OECE with a solid alignment post inserted into a sleeve in one embodiment of the invention.

FIG. 24 illustrates a cross-section of an OSA 306A where cylindrical alignment post 304 is replaced by a solid alignment post 304A made out of a transparent material such as glass. The outer diameter of alignment post 304B is used as the alignment feature while light 316 is transmitted through alignment post 304A.

Figure 25:
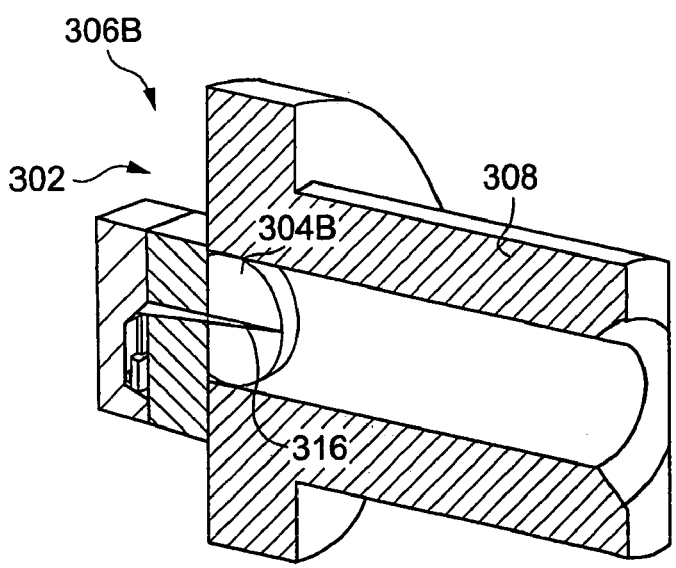
FIG. 25 illustrates an OECE with a solid alignment sphere inserted into a sleeve in one embodiment of the invention.

FIG. 25 illustrates a cross-section of an OSA 306B in one embodiment of the invention. OSA 306B replaces cylindrical alignment post 304 with a partial sphere 304B made out of a transparent material such as glass. The circumference of partial sphere 304B is used as the alignment feature while light 316 is transmitted through partial sphere 304B.

Various other adaptations and combinations of features of the embodiments disclosed are within the scope of the invention. For example, submount 80 can include additional active and passive circuitry. Specifically, submount 80 can be processed to form passive circuitry such as resistors and capacitors, and active circuitry such as transistors. Submount can also be processed to include a bipolar CMOS (BiCMOS) integrated circuit. Numerous embodiments are encompassed by the following claims.

What is claimed is:

1. A method for forming a laser submount, comprising:
   forming a lens above a substrate;
   forming a top layer above the lens;
   mounting a laser on the top layer above the lens and the substrate, wherein the lens is located above the substrate and below the laser;
   further comprising, subsequent to said forming a lens and prior to said forming a top layer;
   forming a planarization layer covering the lens; and
   forming a interconnect above the planarization layer.

2. The method of claim 1, wherein the substrate is selected from the group consisting of silicon, quartz, sodium borosilicate glass, sapphire, gallium arsenide, silicon carbide, and gallium phosphide.

3. The method of claim 1, wherein the planarization layer is an oxide layer.

4. The method of claim 1, wherein the top layer comprises a dielectric layer covering the interconnect, the method further comprising, subsequent to said forming a top layer and prior to said mounting a laser:
   forming a contact pad above the dielectric layer, wherein the laser is electrically connected to the contact pad.

5. The method of claim 4, further comprising, subsequent to said forming a top layer and prior to said mounting a laser:
   forming a sealing ring above the dielectric layer and surrounding the contact pad and the laser.

6. The method of claim 1, further comprising:
   forming at least one of a passive integrated circuit and an active integrated circuit above the substrate.

* * * * *